(12) United States Patent
Dasgupta et al.

(10) Patent No.: US 11,342,232 B2
(45) Date of Patent: May 24, 2022

(54) FABRICATION OF SCHOTTKY BARRIER DIODE USING LATERAL EPITAXIAL OVERGROWTH

(71) Applicant: Intel Corporation, Santa Clara, CA (US)

(72) Inventors: Sansaptak Dasgupta, Hillsboro, OR (US); Marko Radosavljevic, Portland, OR (US); Han Wui Then, Portland, OR (US); Paul Fischer, Portland, OR (US); Walid Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 825 days.

(21) Appl. No.: 16/016,415

(22) Filed: Jun. 22, 2018

(65) Prior Publication Data

US 2019/0393092 A1 Dec. 26, 2019

(51) Int. Cl.
| | |
|---|---|
| *H01L 21/8252* | (2006.01) |
| *H01L 27/06* | (2006.01) |
| *H01L 27/02* | (2006.01) |
| *H01L 29/872* | (2006.01) |
| *H01L 21/02* | (2006.01) |
| *H01L 29/778* | (2006.01) |

(52) U.S. Cl.
CPC ...... *H01L 21/8252* (2013.01); *H01L 27/0255* (2013.01); *H01L 27/0605* (2013.01); *H01L 27/0629* (2013.01); *H01L 21/0254* (2013.01); *H01L 21/02647* (2013.01); *H01L 29/778* (2013.01); *H01L 29/872* (2013.01)

(58) Field of Classification Search
CPC ............. H01L 21/8252; H01L 27/0605; H01L 27/0629; H01L 27/0255; H01L 29/872; H01L 21/0254; H01L 21/02647; H01L 29/778; H01L 29/66212; H01L 29/66462; H01L 29/517; H01L 29/4236; H01L 29/0847; H01L 29/0657; H01L 29/7786; H01L 29/2003; H01L 29/205; H01L 21/02458; H01L 29/66143; H01L 29/0684; H01L 27/0296
See application file for complete search history.

(56) References Cited

U.S. PATENT DOCUMENTS

| | | | | |
|---|---|---|---|---|
| 9,960,154 | B2* | 5/2018 | Kinzer | H01L 29/66462 |
| 2013/0062723 | A1* | 3/2013 | Henning | H01L 29/8611 |
| | | | | 257/484 |
| 2013/0119393 | A1* | 5/2013 | Zhu | H01L 29/0688 |
| | | | | 257/76 |
| 2013/0313570 | A1* | 11/2013 | Sdrulla | H01L 29/872 |
| | | | | 257/77 |
| 2014/0138705 | A1* | 5/2014 | Zhang | H01L 29/0619 |
| | | | | 257/77 |
| 2014/0239346 | A1* | 8/2014 | Green | H01L 29/7787 |
| | | | | 257/192 |

* cited by examiner

*Primary Examiner* — Jonathan Han
(74) *Attorney, Agent, or Firm* — Schwabe, Williamson & Wyatt, P.C.

(57) ABSTRACT

A diode is disclosed. The diode includes a semiconductor substrate, a hard mask formed above the substrate, vertically oriented components of a first material adjacent sides of the hard mask, and laterally oriented components of the first material on top of the hard mask. The laterally oriented components are oriented in a first direction and a second direction. The diode also includes a second material on top of the first material. The second material forms a Schottky barrier.

20 Claims, 6 Drawing Sheets

FABRICATION OF SCHOTTKY BARRIER DIODE USING LATERAL EPITAXIAL OVERGROWTH

TECHNICAL FIELD

Embodiments of the disclosure pertain to fabricating Schottky diodes and, in particular, fabricating Schottky diodes using lateral epitaxial overgrowth.

BACKGROUND

Some conventional radio frequency (RF) systems use on-chip electrostatic discharge (ESD) protection circuits to provide ESD protection for system circuitry. The design of ESD protection circuits for such systems can be challenging. ESD protection circuits need to have current density and leakage current characteristics that enable them to provide effective protection. In particular, the ESD protection circuit needs to have the capacity to handle significant amounts of current in response to an ESD event and to exhibit low reverse leakage current during normal operation.

GaN transistors are promising candidates for use in future RF products such as 5G products. In order to enable a fully integrated GaN RF frontend for such products, there is a need for ESD protection circuits that use high performance Schottky diodes. However, Schottky diodes can exhibit higher leakage current than some other types of diodes. Conventional approaches to ESD protection circuit design do not adequately address current density and reverse leakage current challenges.

DESCRIPTION OF THE EMBODIMENTS

Approaches for fabricating Schottky diodes using lateral epitaxial overgrowth are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In an embodiment, a co-integration of GaN transistors and Schottky diodes in the same die is done using single operation regrowth of epitaxial material to form Schottky diode components and transistor source and drain components of a co-integrated semiconductor structure. Embodiments, as part of the fabrication of a Schottky diode, utilize the regrowth of highly doped material to form a layer of material over which a Schottky barrier is formed. The highly doped layer of material is formed during source-drain epitaxial regrowth operations for a co-integrated transistor. Embodiments utilize lateral overgrowth of the highly doped material to form a highly doped material layer that has low defect density underneath the Schottky barrier. These material characteristics are used to fabricate Schottky diodes that can deliver high current density. In addition, the low defect density reduces reverse bias vertical leakage current. In embodiments, the highly doped material is formed in a single operation without extra regrowth.

Figure 1:
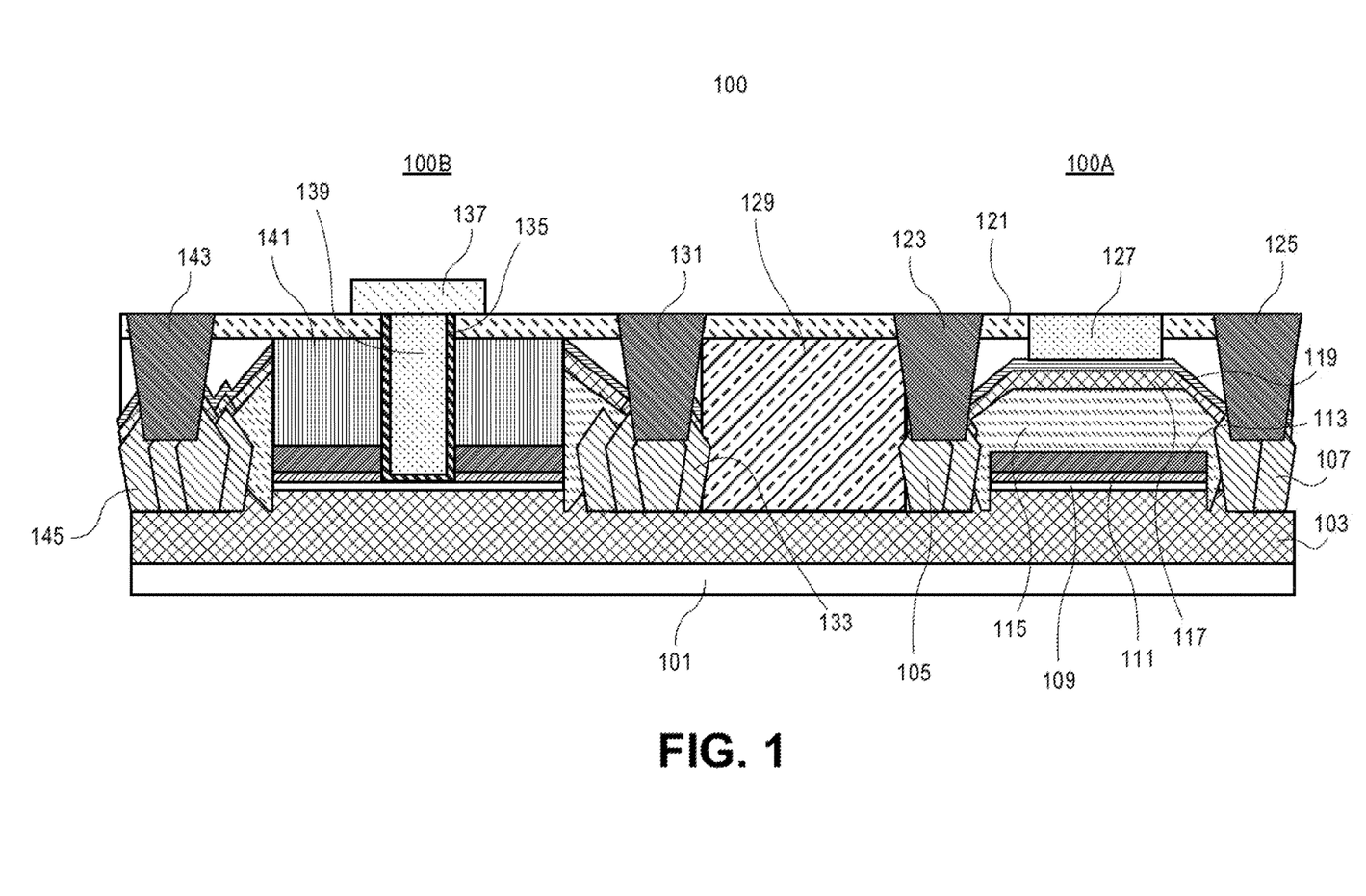
FIG. 1 is an illustration of an integrated metal-oxide-semiconductor-high-electron-mobility-transistor (MOSHEMT) and GaN Schottky diode structure according to an embodiment.

FIG. 1 is an illustration of a cross-section of an integrated MOSHEMT and GaN Schottky diode semiconductor structure according to an embodiment. In an embodiment, single operation epitaxial regrowth is used to form thin films as part of the structuring of transistor source and drain regions and Schottky diode cathode components of the co-integrated semiconductor structure. The process results in a Schottky diode that delivers high current density and exhibits low reverse bias leakage current.

FIG. 1 shows a Schottky diode 100A that includes substrate 101, epitaxial layer 103, first cathode region 105, second cathode region 107, semiconductor 109, polarization layer 111, insulator layer 113, highly doped and low defect density semiconductor material 115, unintentionally doped layer 117, Schottky barrier layer 119, insulator 121, first cathode region contact 123, second cathode region contact 125, Schottky metal 127 and insulator 129. In addition, FIG. 1 shows transistor 100B, that includes in addition to the structures that are shared with integrated Schottky diode 100A, source contact 131, source 133, high-k material 135, gate contact 137, gate 139, insulator 141 (hard mask), drain contact 143 and drain 145.

Referring to FIG. 1, the Schottky diode 100A includes the semiconductor material 115 which is highly doped and has low defect density. The low defect density of the semiconductor material 115 enables the Schottky diode 100A to deliver current of higher density than could be delivered using materials that have a higher defect density. In an embodiment, the semiconductor material 115 is formed from highly doped GaN. In an embodiment, semiconductor material 115 is formed during the formation of the source 133, the drain 145, the first cathode region 105 and the second cathode region 107. The material that is grown in the first cathode region 105 and the second cathode region 107 of the semiconductor structure 100 accumulates in those regions and vertically rises along the sidewalls of the stack of materials of the semiconductor structure 100 that includes the semiconductor layer 109, the polarization layer 111, the hard mask layer 113 and parts of the epitaxial layer 103. In an embodiment, the semiconductor material 115 eventually extends above the hard mask 113. Thereafter, in an embodiment, process conditions are adjusted to promote lateral growth of the semiconductor material. The accumulating material then moves laterally from the sides of the hard mask 113 until the top surface of the hard mask 113 is covered. The manner in which the lateral regrowth of epitaxial material is used to form the highly doped and low defect density semiconductor material 115 is discussed herein with reference to FIGS. 2A-2E.

The hard mask layer 113 isolates the material layers that are located above the hard mask layer 113 from the defects of the substrate 101 that is located below the hard mask layer 113. For example, defects of the substrate 101 are projected upwards from the substrate 101 through the GaN epitaxial layer 103, the semiconductor layer 109 and the polarization layer 111. However, the hard mask layer 113 has a physical structure that is impenetrable by the defects. Thus, the upward projection of the defects is stopped by the hard mask layer 113. It should be appreciated that in an embodiment the material that is located above the hard mask layer 113, such as the low defect density and highly doped semiconductor 115, unintentionally doped layer 117 and the Schottky barrier layer 119, are protected by the defect blocking utility of the hard mask layer 113.

In operation, upon the occurrence of an ESD event, the Schottky diode 100A becomes forward biased and routes the ESD current to ground. In this manner, the current is prevented from damaging circuitry such as RF device front-end circuitry that can include transistors such as the transistor 100B (which can be located at the front end of an associated RF device). In an embodiment, because the material that is formed underneath the Schottky barrier is highly doped, the current density of the current that flows in the Schottky diode 100A is high, which provides Schottky diode 100A with a robust current handling capacity. In addition, when the Schottky diode 100A is reversed biased, because the material that is formed underneath the Schottky barrier is low in defects, reverse current leakage is low, and reverse voltage protection is maximal.

In an embodiment, the substrate 101 can be formed from silicon. In other embodiments, the substrate 101 can be formed from other materials. In an embodiment, the epitaxial layer 103 can be formed from GaN. In other embodiments, the epitaxial layer 103 can be formed from other materials. In an embodiment, the first cathode 105 and the second cathode 107 can be formed from InGaN. In other embodiments, the first cathode 105 and the second cathode 107 can be formed from other materials. In an embodiment, the semiconductor 109 can be formed from an AlN. In other embodiments, semiconductor 109 can be formed from other materials. In an embodiment, the polarization layer 111 can be formed from AlInN. In other embodiments, the polarization layer 111 can be formed from other materials. In an embodiment, the hard mask layer 113 can be formed from a nitride. In other embodiments, the hard mask layer 113 can be formed from other materials. In an embodiment, the highly doped and low defect density semiconductor layer 115 can be formed from InGaN. In other embodiments, the highly doped and low defect density semiconductor layer 115 can be formed from other materials. In an embodiment, the unintentionally doped semiconductor 117 can be formed from GaN. In other embodiments, the unintentionally doped semiconductor 117 can be formed from other materials. In an embodiment, the Schottky barrier layer 119 can be formed from AlGaN or AlInN. In other embodiments, the Schottky barrier layer 119 can be formed from other materials. In an embodiment, the insulator 121 can be formed from an oxide. In other embodiments, the insulator 121 can be formed from other materials. In an embodiment, the first cathode contact 123 can be formed from Ti, Al or W. In other embodiments, the first cathode contact 123 can be formed from other materials. In an embodiment, the second cathode contact 125 can be formed from Ti, Al or W. In other embodiments, the second cathode contact 125 can be formed from other materials. In an embodiment, the Schottky metal 127 can be formed from nickel, platinum or titanium nitride. In other embodiments, the Schottky metal 127 can be formed from other materials. In an embodiment, the insulator 129 can be formed from an oxide. In other embodiments, the insulator 129 can be formed from other materials. In an embodiment, the source 133 can be formed from InGaN. In other embodiments, the source 133 can be formed from other materials. In an embodiment, the source contact 131 can be formed from Ti, Al or W. In other embodiments, the source contact 131 can be formed from other materials. In an embodiment, the drain 145 can be formed from InGaN. In other embodiments, the drain 145 can be formed from other materials. In an embodiment, the drain contact 143 can be formed from Ti, Al or W. In other embodiments, the drain contact 143 can be formed from other material. In one embodiment, the gate 139 can be formed from nickel, platinum or titanium nitride. In other embodiments, the gate 139 can be formed from other materials. In an embodiment, the gate contact 137 can be formed from Ti, Al or W. In other embodiments, the gate contact 137 can be formed from other material. In an embodiment, high-k material 135 can include but is not limited to hafnium oxide. In other embodiments, high-k material can include other materials. In an embodiment, the tall hard mask 141 can be formed from polysilicon or silicon dioxide. In other embodiments, the tall hard mask 141 can be formed from other materials.

Advantages of embodiments include the formation of both a highly doped and low defect density semiconductor layer 115 underneath a Schottky barrier layer 119 and the Schottky barrier layer 119 itself during an operation for forming the source and the drain of a co-integrated transistor 100B. Thus, multiple operations for forming these structures are avoided. As discussed above, in an embodiment, the formation of the highly doped and low defect density semiconductor layer 115 can be accomplished using lateral overgrowth techniques. In an embodiment, the highly doped and low defect density semiconductor layer 115 is formed from high quality material that has a low defect density. In addition, in an embodiment, the orientation of the lateral overgrowth contributes to the low defect density of the highly doped and low defect density semiconductor layer 115. Moreover, as described above, the hard mask 113 protects the highly doped and low defect density semiconductor layer 115 from defects that are projected from the substrate 103. The highly doped and low defect density semiconductor layer 115 with low defect density results in a Schottky diode that delivers high current density and exhibits low reverse bias leakage current.

Figure 2A:
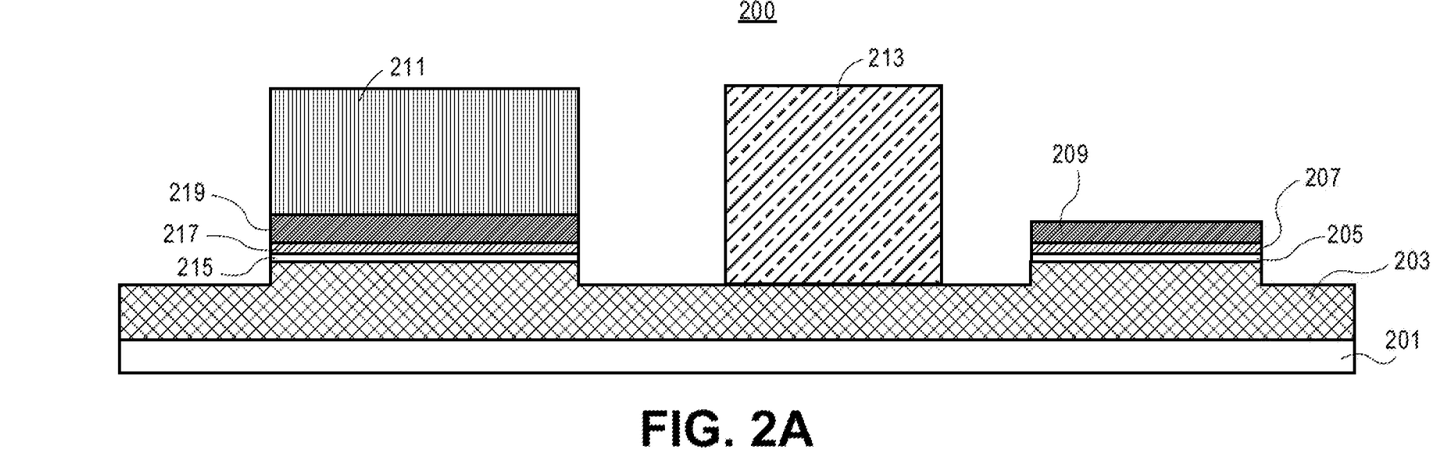
FIGS. 2A-2F are illustrations of cross-sectional views of an integrated MOSHEMT and Schottky barrier diode structure during fabrication according to an embodiment.

FIGS. 2A-2F are illustrations of cross-sectional views of a semiconductor structure 200 during a fabrication process for a Schottky barrier diode that uses lateral overgrowth. Referring to FIG. 2A, after a plurality of operations, a cross-section of semiconductor structure 200 is formed that includes substrate 201, epitaxial layer 203, semiconductor layer 205, polarization layer 207 short hard mask 209, tall hard mask 211, oxide 213, semiconductor 215, polarization layer 217 and short hard mask 219. In an embodiment, the cross-section of FIG. 2A is an illustration of the appearance of the semiconductor structure 200 before source/drain epitaxial regrowth operations. In an embodiment, unlike conventional masking approaches which use source/drain epitaxial regrowth processes based on an epitaxial region etch out and undercut, a tall hard mask 211 is used for epitaxial regrowth. In an embodiment, a tall (e.g., greater than 150 nm) hard mask 211 is formed for source-drain epitaxial regrowth in the transistor region. Moreover, a short (e.g., approximately 20-30 nm) hard mask 209 is formed for epitaxial regrowth in the Schottky diode region. In other embodiments, hard masks of other heights can be used. In an embodiment, the depth of the epitaxial undercut (EUC) can be the same in both the transistor and the Schottky diode region.

Figure 2B:
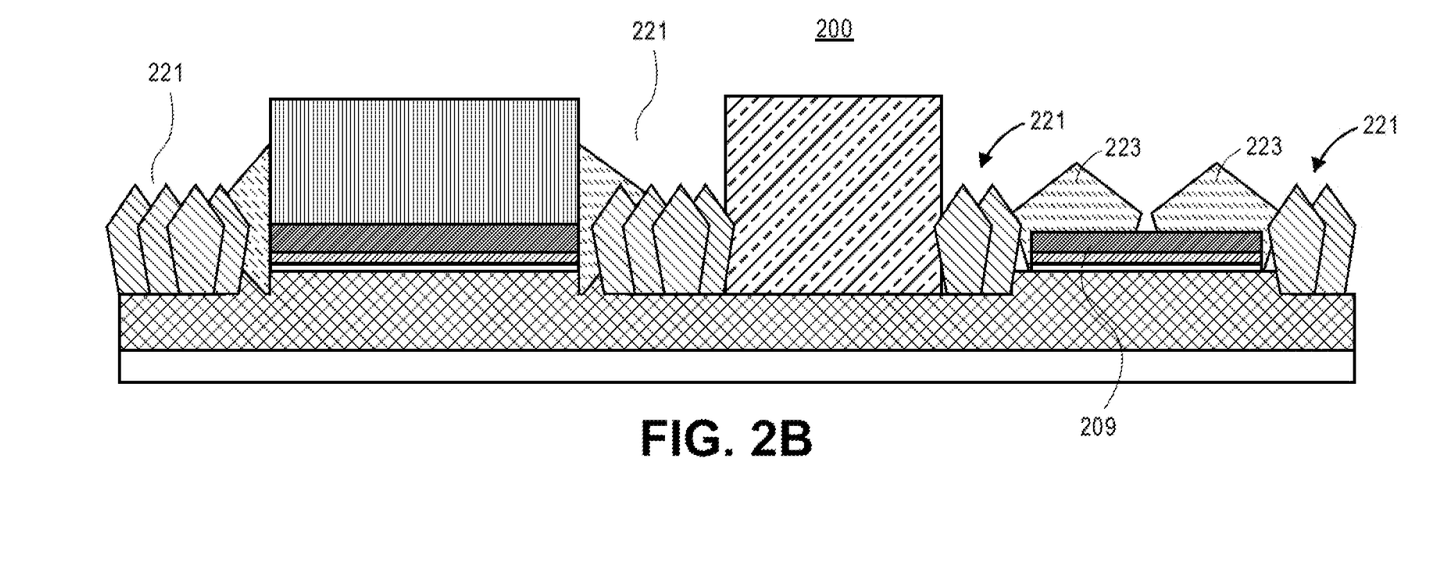

Referring to FIG. 2B, after one or more operations that result in the cross-section of the semiconductor structure 200 that is shown in FIG. 2A, a source-drain epitaxial growth operation is performed. In an embodiment, the source-drain epitaxial growth operation can be performed by loading the wafer into an epitaxial reactor for the source-drain epitaxial growth operation. In other embodiments, the epitaxial growth operation can be performed in any other suitable manner of performing the epitaxial growth operation. In an embodiment, the first thin film that is grown is a highly doped n+ InGaN film 221. In an embodiment, the highly doped n+ InGaN film 221 is doped with Si. In other embodiments, the n+ InGaN film 221 can be doped with other materials. Because the hard mask 209 for the Schottky region is shallow, initially, the n+ InGaN film 221 grows vertically along the sidewalls of the hard mask 209 and eventually extends vertically above the top of hard mask 209. The n+ InGaN film 221 then grows laterally 223 along the top surface of the hard mask 209 from both sides and eventually completely covers the top surface of the hard mask 209. The InGaN crystal that grows along the sidewalls of the hard mask 209 is high quality InGaN crystal that has a low defect density. This same high quality InGaN crystal with low defect density laterally overgrows the shallow hard mask region 209. The epitaxial growth operation helps to decouple the defects of the substrate from critical regions of the Schottky diode 200A as the overgrowth above the shallow hard mask 209 is protected from the defects that are projected from the substrate 201 by the shallow hard mask 209. Thus, in embodiments, because Schottky diode reverse leakage current is directly proportional to defect density, the Schottky diode 200A is able to provide low reverse leakage current. In this manner the challenge of achieving low defect density that is described herein is addressed.

Figure 2C:
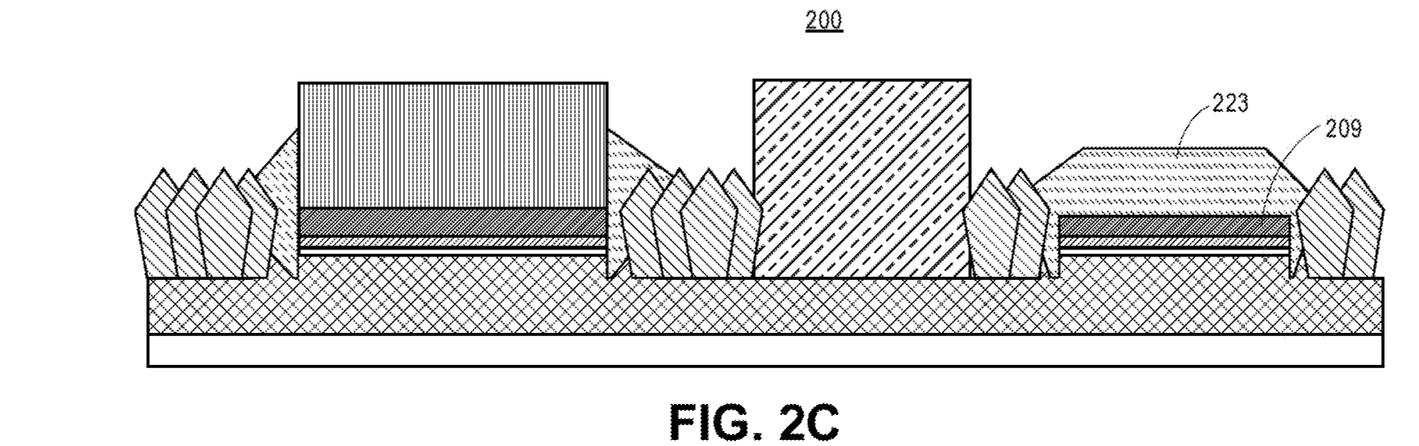

Referring to FIG. 2C, after one or more operations that result in the cross-section shown in FIG. 2B, the n+ InGaN film 223 that is grown laterally along the top surface of the hard mask 209 is grown longer by configuring process conditions to foster lateral overgrowth of the top surface of the hard mask 209 as opposed to vertical growth. In an embodiment, this process results in the merger of the n+ InGaN film 223 overgrowth on the top surface of the hard mask 209 in the Schottky diode region 200A.

Figure 2D:
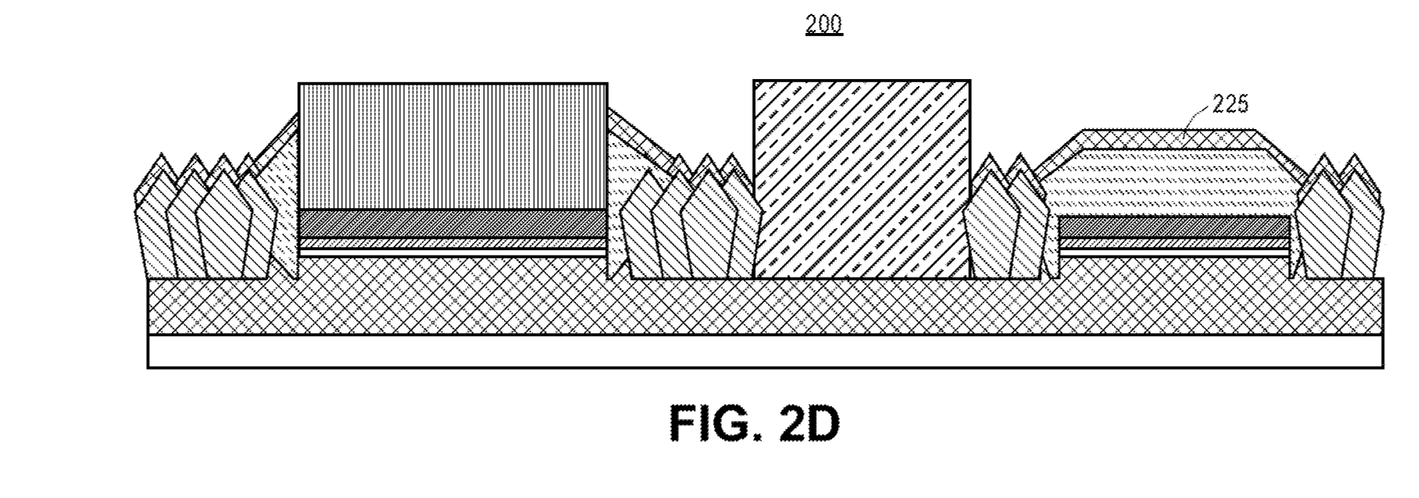
Figure 2E:
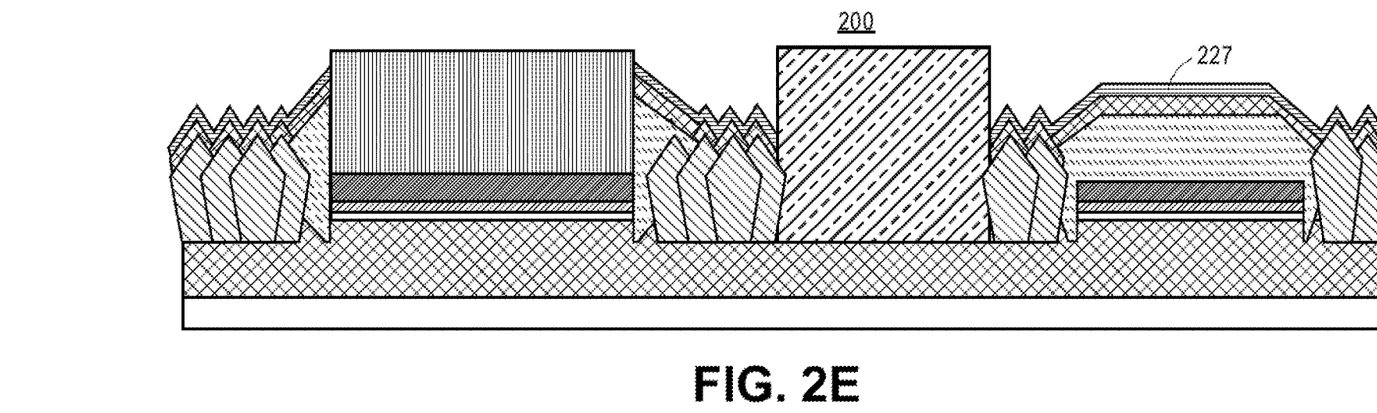

Referring to FIG. 2D, after one or more operations that result in the cross-section of the semiconductor structure 200 shown in FIG. 2C, a thin layer of undoped GaN 225 is grown. In an embodiment, the thin layer of undoped GaN 225 can have a thickness of approximately 20-30 nm. In other embodiments, the thin layer of undoped GaN 225 can have other thicknesses. Referring to FIG. 2E, after one or more operations that result in the cross-section of the semiconductor structure 200 shown in FIG. 2D, a material 227 that is chosen for setting the Schottky barrier for the Schottky diode is grown above the thin layer of undoped GaN 225. In an embodiment, the material 227 that is chosen for setting the Schottky barrier can include a thin layer of AlGaN (30%)~1 eV barrier, of 10 nm thickness. In other embodiments, other materials that have other thicknesses can be used for the material for setting the Schottky barrier.

Figure 2F:
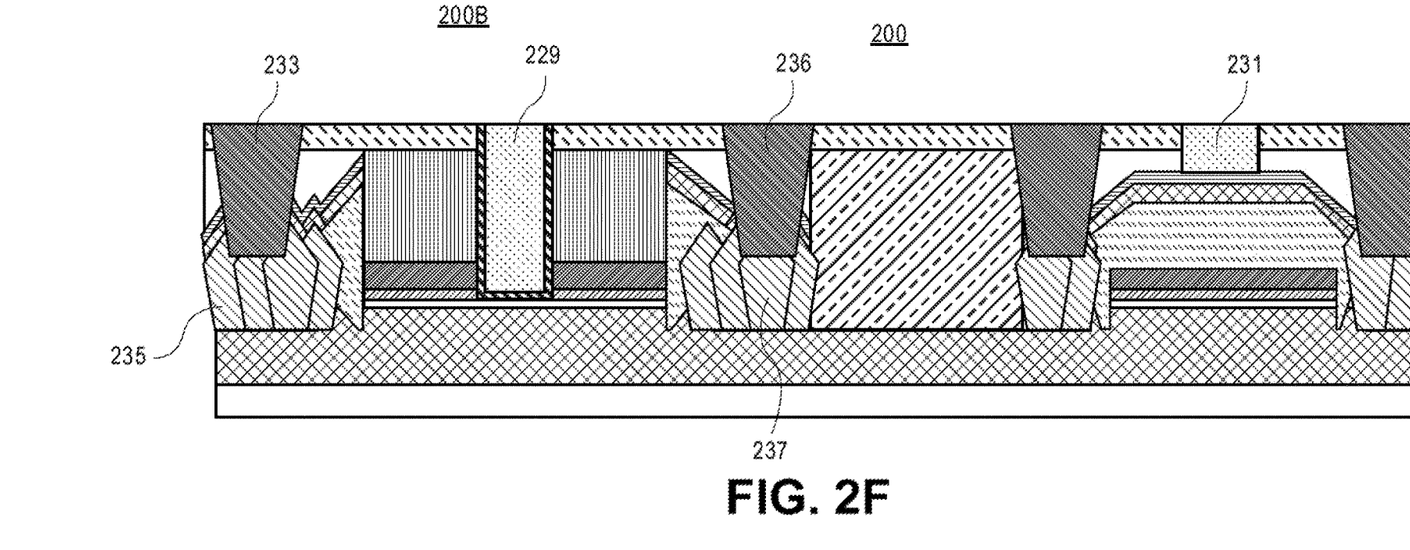

Referring to FIG. 2F, after one or more operations that result in a cross-section of the semiconductor structure 200 such as is shown in FIG. 2E (after the epitaxial growth has been completed) the different height areas of the semiconductor structure 200 are planarized. Thereafter, a gate for the MOS HEMT device 229, a Schottky contact 231 for the diode, and ohmic metal contacts 233 and 236 to the source 235 and the drain 237 regions of the MOS HEMT device 200B are formed. In an embodiment, a dry etch is used to etch out the undoped GaN 225 and the AlGaN 227 layers to form a space for ohmic metal contacts in the Schottky diode region before the deposition of ohmic metals.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 3:
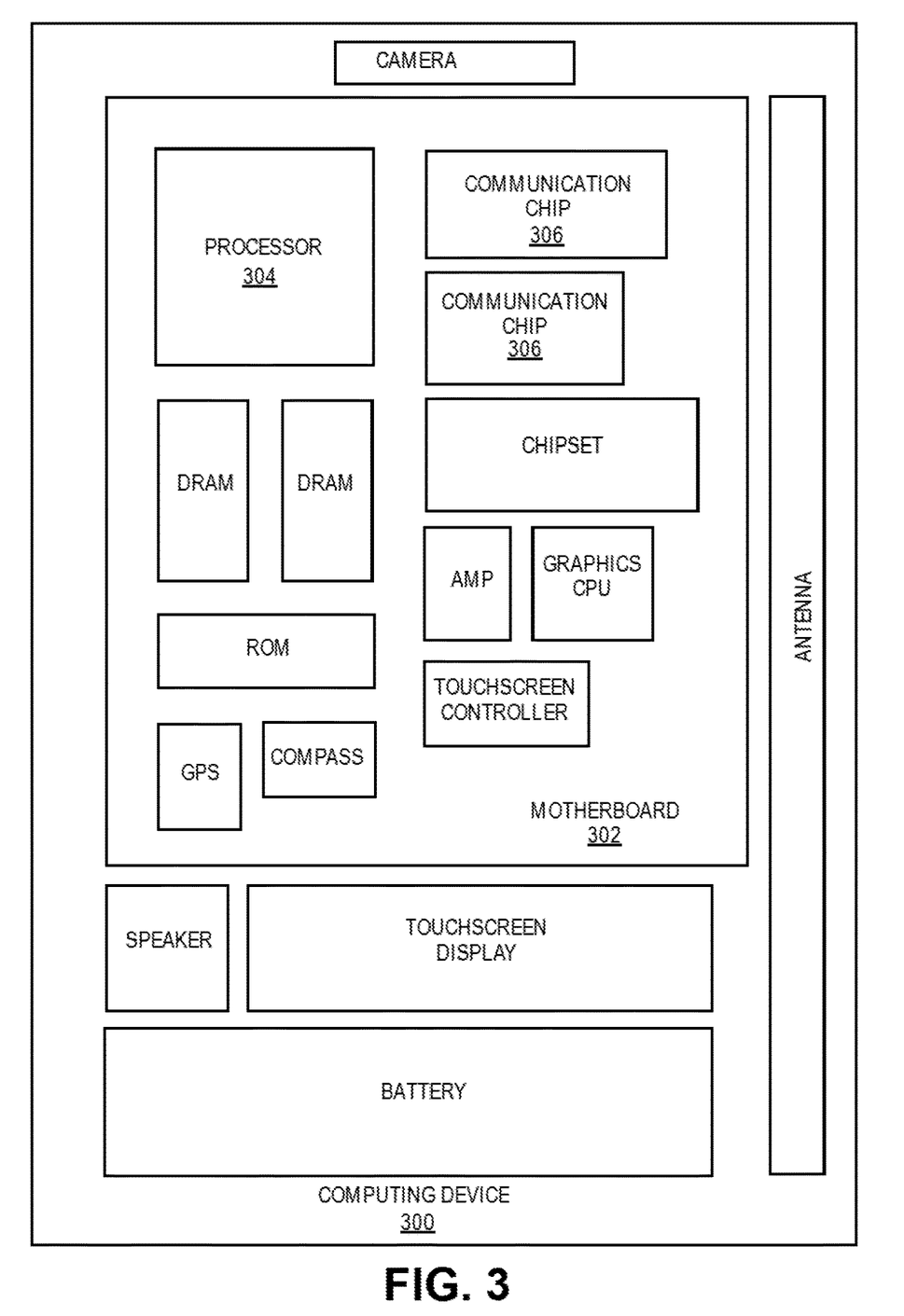
FIG. 3 illustrates a computing device in accordance with an embodiment.

FIG. 3 illustrates a computing device 300 in accordance with one implementation of the invention. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of the invention, the integrated circuit die of the communication chip includes one or more devices, such as MOS-FET transistors built in accordance with implementations of the invention.

In further implementations, another component housed within the computing device 300 may contain an integrated circuit die that includes one or more devices, such as MOS-FET transistors built in accordance with implementations of the invention.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

Figure 4:
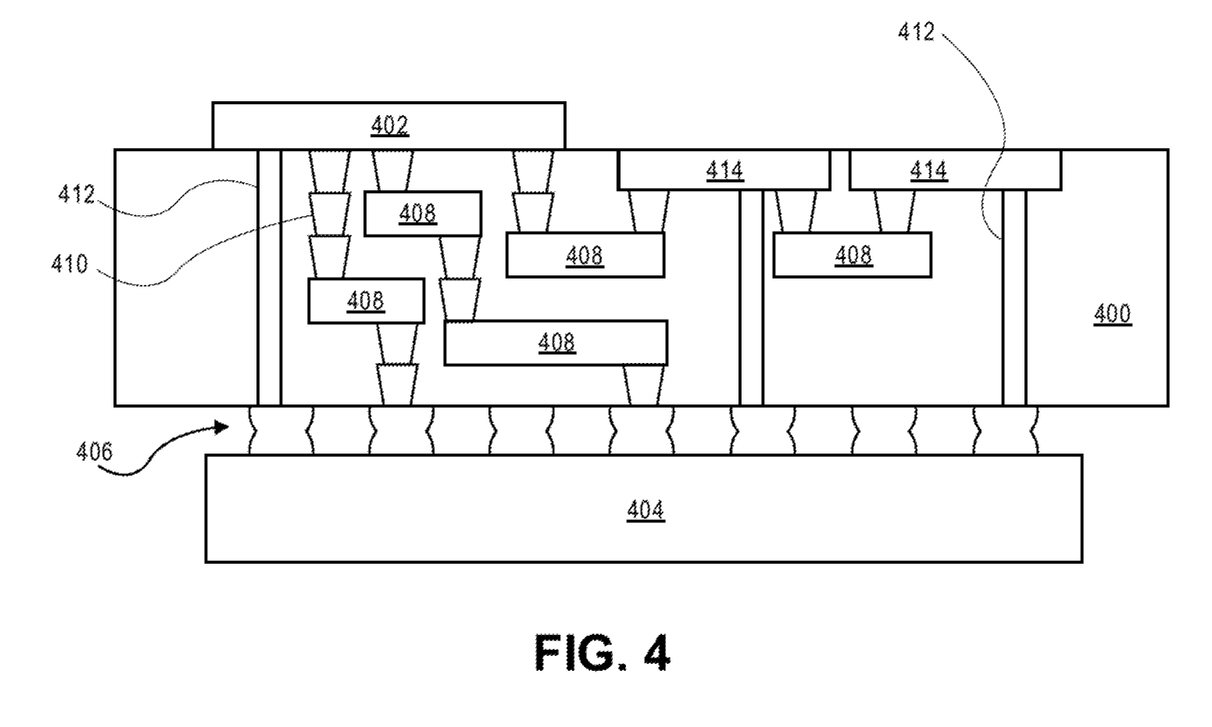
FIG. 4 illustrates an interposer that includes one or more embodiments.

FIG. 4 illustrates an interposer 400 that includes one or more embodiments of the invention. The interposer 400 is an intervening substrate used to bridge a first substrate 402 to a second substrate 404. The first substrate 402 may be, for instance, an integrated circuit die. The second substrate 404 may be, for instance, a memory module, a computer motherboard, or another integrated circuit die. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400. In accordance with embodiments of the invention, apparatuses or processes disclosed herein may be used in the fabrication of interposer 400.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

A diode comprises a semiconductor substrate, a hard mask formed above the substrate, vertically oriented components of a first material adjacent sides of the hard mask, and laterally oriented components of the first material on top of the hard mask. The laterally oriented components are oriented in a first direction and a second direction. A second material is on top of the first material. The second material forms a Schottky barrier.

Example Embodiment 2

The diode of example embodiment 1, wherein the laterally oriented components are directed from a first side of the hard mask and a second side of the hard mask.

Example Embodiment 3

The diode of example embodiment 1, wherein the hard mask prevents defects from the substrate from reaching the first material.

Example Embodiment 4

The diode of example embodiment 1, wherein the hard mask includes a nitride material.

Example Embodiment 5

The diode of example embodiment 1, wherein a layer of gallium nitride is on the substrate and under the hard mask.

Example Embodiment 6

The diode of example embodiment 1, wherein a Schottky metal is formed above the Schottky barrier.

Example Embodiment 7

The diode of example embodiment 1, 2, 3, 4, 5 or 6 wherein the diode is a Schottky diode.

Example Embodiment 8

A semiconductor device comprises a transistor and a diode. The diode comprises a semiconductor substrate, a hard mask formed above the substrate, vertically oriented components of a first material adjacent sides of the hard mask, and laterally oriented components of the first material on top of the hard mask. The laterally oriented components are oriented in a first direction and a second direction. A second material is formed above the first material. The second material forms a Schottky barrier.

Example Embodiment 9

The semiconductor device of example embodiment 8, wherein the laterally oriented components are directed from a first side of the hard mask and a second side of the hard mask.

Example Embodiment 10

The semiconductor device of example embodiment 8, wherein the hard mask prevents defects from the substrate from reaching the first material.

Example Embodiment 11

The semiconductor device of example embodiment 8, wherein the hard mask includes a nitride material.

Example Embodiment 12

The semiconductor device of example embodiment 8, 9, 10 or 11 wherein a layer of gallium nitride is on the substrate and under the hard mask.

Example Embodiment 13

The semiconductor device of claim 1, wherein a Schottky metal is formed above the Schottky barrier.

Example Embodiment 14

The semiconductor device of claim 13, wherein the diode is a Schottky diode.

Example Embodiment 15

A method comprises forming a semiconductor substrate, forming a hard mask formed above the substrate, forming vertically oriented components of a first material adjacent sides of the hard mask, and forming laterally oriented components of the first material on top of the hard mask. The laterally oriented components are oriented in a first direction and a second direction. A second material is formed above the first material, the second material forming a Schottky barrier.

Example Embodiment 16

The method of example embodiment 15, wherein the laterally oriented components are directed from a first side of the hard mask and a second side of the hard mask.

Example Embodiment 17

The method of example embodiment 15, wherein the hard mask prevents defects from the substrate from reaching the first material.

Example Embodiment 18

The method of example embodiment 15, wherein the hard mask includes HSON.

Example Embodiment 19

The method of example embodiment 15, wherein a layer of GaN is on the substrate and under the hard mask.

Example Embodiment 20

The method of example embodiment 15, wherein a Schottky metal is formed above the Schottky barrier.

What is claimed is:

1. A diode, comprising:
   a semiconductor substrate;
   a hard mask above the substrate;
   vertically oriented components of a first semiconductor material adjacent sides of the hard mask;
   laterally oriented components of the first semiconductor material on top of the hard mask, the laterally oriented components oriented in a first direction and a second direction; and
   a second material above the first semiconductor material, the second material forming a Schottky barrier.

2. The diode of claim 1, wherein the laterally oriented components are directed from a first side of the hard mask and a second side of the hard mask.

3. The diode of claim 1, wherein the hard mask prevents defects from the substrate from reaching the first semiconductor material.

4. The diode of claim 1, wherein the hard mask includes a nitride material.

5. The diode of claim 1, wherein a layer of gallium nitride is on the substrate and under the hard mask.

6. The diode of claim 1, wherein a Schottky metal is above the Schottky barrier.

7. The diode of claim 1, wherein the diode is a Schottky diode.

8. The semiconductor device of claim 1, wherein a Schottky metal is above the Schottky barrier.

9. The semiconductor device of claim 8, wherein the diode is a Schottky diode.

10. A semiconductor device, comprising:
    a transistor: and
    a diode, the diode comprising:
       a semiconductor substrate;
       a hard mask above the substrate;
       vertically oriented components of a first semiconductor material adjacent sides of the hard mask;
       laterally oriented components of the first semiconductor material on top of the hard mask, the laterally oriented components oriented in a first direction and a second direction; and
       a second material above the first semiconductor material, the second material forming a Schottky barrier.

11. The semiconductor device of claim 10, wherein the laterally oriented components are directed from a first side of the hard mask and a second side of the hard mask.

12. The semiconductor device of claim 10, wherein the hard mask prevents defects from the substrate from reaching the first semiconductor material.

13. The semiconductor device of claim 10, wherein the hard mask includes a nitride material.

14. The semiconductor device of claim 10, wherein a layer of gallium nitride is on the substrate and under the hard mask.

15. A method, comprising:
- forming a semiconductor substrate;
- forming a hard mask above the substrate;
- forming vertically oriented components of a first semiconductor material adjacent sides of the hard mask;
- forming laterally oriented components of the first semiconductor material on top of the hard mask, the laterally oriented components oriented in a first direction and a second direction; and
- forming a second material above the first semiconductor material, the second material forming a Schottky barrier.

16. The method of claim 15, wherein the laterally oriented components are directed from a first side of the hard mask and a second side of the hard mask.

17. The method of claim 15, wherein the hard mask prevents defects from the substrate from reaching the first semiconductor material.

18. The method of claim 15, wherein the hard mask includes a nitride material.

19. The method of claim 15, wherein a layer of gallium nitride is on the substrate and under the hard mask.

20. The method of claim 15, wherein a Schottky metal is formed above the Schottky barrier.

* * * * *